United States Patent [19]

Murakami et al.

[11] 4,437,540

[45] Mar. 20, 1984

[54] LOUD-SPEAKER

[75] Inventors: Naoyuki Murakami; Hiroshi Zyo, both of Tokyo, Japan

[73] Assignee: Naoyuki Murakami, Tokyo, Japan

[21] Appl. No.: 472,958

[22] Filed: Mar. 7, 1983

Related U.S. Application Data

[62] Division of Ser. No. 192,187, Sep. 30, 1980, Pat. No. 4,391,346.

[30] Foreign Application Priority Data

| | | | |
|---|---|---|---|
| Oct. 4, 1979 | [JP] | Japan | 54-127325 |
| Aug. 30, 1980 | [JP] | Japan | 55-120187 |

[51] Int. Cl.$^{3}$ ............ H05K 5/00

[52] U.S. Cl. ............ 181/147; 181/150; 181/152; 181/154; 181/199

[58] Field of Search ............ 181/144–147, 181/152, 159, 163, 199, 150, 154; 381/24, 90

[56] References Cited

U.S. PATENT DOCUMENTS

| | | | |
|---|---|---|---|
| 2,194,664 | 3/1940 | McDonald | 181/145 |
| 3,608,665 | 9/1971 | Drisi | 181/150 |
| 3,715,008 | 2/1973 | Lover | 181/147 |
| 4,213,515 | 7/1980 | Loupmen | 181/145 |

FOREIGN PATENT DOCUMENTS

| | | | |
|---|---|---|---|
| 952360 | 11/1956 | Fed. Rep. of Germany | 181/144 |
| 558119 | 2/1974 | Switzerland | 181/144 |

*Primary Examiner*—Benjamin R. Fuller
*Attorney, Agent, or Firm*—Polster, Polster and Lucchesi

[57] ABSTRACT

A loud-speaker of a closed or a bass-reflex type, wherein a plurality of speaker units are intensively arranged behind an opening of a baffle board or a throat of a sounding horn with the sound wave radiating direction thereof being concentrated toward the center axis of the opening of throat, and the total area of the entire diaphragms of the speaker units is made substantially equal to, or larger than, the area of the opening or throat.

2 Claims, 11 Drawing Figures

LOUD-SPEAKER

This is a division of application Ser. No. 192,187, filed Sept. 30, 1980, now U.S. Pat. No. 4,391,346.

BACKGROUND OF THE INVENTION a. Field of the Invention

This invention relates to a loud-speaker, and, more particularly, it is concerned with a high output loud-speaker for reproducing medium and low-pitched sounds.

b. Description of Prior Arts

Heretofore, this kind of loud-speaker is so constructed that a plurality of loud-speaker units 5, with the area of a vibrating plate or a diaphragm of each speaker unit being made wide or highly compliant, are arranged in a row on the front baffle board of a speaker box B of a closed type or a bass-reflex type, or a plurality of loud speaker units are disposed on a flat surface of a broad baffle plate, as shown in FIG. 1 of the accompanying drawing.

A level of an output sound pressure in this type of loud-speaker is usually defined in terms of "output sound pressure level of each speaker unit × number of the speaker units used". In reality, however, the electrical signal applied to the entire speaker units is not effectively converted to sound on account of the sound intereference which takes place in the diaphragm of each speaker unit, and mutual sound interferences among the speaker units which take place in front of the baffle board.

Also, as shown in FIG. 2 of the accompanying drawing, a loud-speaker of a construction, in which a sound horn H is fitted in front of a speaker unit having a large mouth diameter causes partitioning vibration between the surrounding part of the diaphragm and the center part thereof to a higher frequency side even in its low-pitched sound region, because the area of the diaphragm of the speaker unit 5 is large. On account of this, it occurs from time to time that the diaphragm does not bring about perfect piston vibration with respect to the sounding horn H. In other words, the throat diameter of the sounding horn is too large in comparison with the diaphragm part to obtain the effective horning effect.

Generally speaking, the sound pressure at the low-pitched sound region of a loud-speaker unit tends to attenuate in a frequency range lower than 100 to 200 Hz. On account of this, when reproduction of the low-pitched sound is particularly regarded as important, it has so far been the usual practice to use a loud-speaker unit of a large mouth diameter or a plurality of small-diameter speaker units in combination with such large-diameter speaker unit for obtaining required low-pitched sound pressure.

However, the loud-speaker unit of the large diameter has a large mass in its vibration system, on account of which it has such a property that its reproduction frequency band becomes narrow, hence its transition characteristic is also poor. Moreover, even if a plurality of small-diameter speaker units are combined with the large-diameter speaker unit, it is still impossible to perfectly solve the problem of attenuation of the sound pressure in the low-pitched sound region. In addition, since a plurality of the loud-speaker units are fitted on the baffle board in a predetermined arrangement, there inevitably takes place in front of the baffle board the interferences among the sounds from each of the loudspeaker units with the consequence that reproduction of the low-pitched sound is insufficient.

For improvement in the abovementioned points, there has been known a phase-inverting type loud-speaker (generally called "bass-reflex" type loud-speaker unit). Even in this type of loud-speaker, the low-pitched sound from the speaker units and the low-pitched sound from the phase-inverting duct mutually interfere to make it still unable to reach a condition where sufficient reproduction of the low-pitched sound is realized, because a space interval between the phase-inverting duct and the speaker units is made three times or more as long as the effective vibrating radius of the speaker unit.

SUMMARY OF THE INVENTION

It is therefore a primary object of the present invention to provide a loud-speaker with its output and sound quality being improved by removing the abovementioned disadvantages which the conventional high output loud-speaker for reproducing medium and low-pitched sounds possesses.

It is another object of the present invention to provide a loud-speaker which is excellent in its reproduction effect of the low-pitched sound without attenuation of the sound pressure even at a low frequency, and from which the above-described disadvantages inherent in the conventional phase-inverting type loud-speaker and other types of low-pitched sound reproduction loud-speaker have been removed.

According to the present invention, in one aspect thereof, there is provided a loud-speaker comprising: a casing having a baffle board or a sounding horn in its front part; and a plurality of speaker units intensively arranged behind the baffle board or sounding horn with the sound wave radiating direction of each speaker unit being made toward the center axis of an opening of the baffle board or of throat of the sounding horn, the total area of the entire diaphragms of the speaker units being made substantially equal to, or larger than, the area of the opening or the throat.

According to the present invention, in another aspect thereof, there is provided a loud-speaker comprising: a casing having a baffle board or a sounding horn in its front part; a plurality of speaker units intensively arranged behind the baffle board or sounding horn with the sound wave radiating direction of each speaker unit being concentrated on the center axis of the opening of the baffle board or of throat of the sounding horn, or in parallel with the center axis; and a phase-inverting duct disposed at the center of the intensively arranged speaker units, the total area of the entire diaphragms of the speaker units being made substantially equal to, or larger than, the area of the opening or the throat.

There have thus been outlined, rather broadly, the more important features of the present invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception, upon which this diclosure is based may readily be utilized as a basis for the designing of other structures for the carrying out of the purposes of the present invention. It is therefore important that the claims be regarded as including such equivalent construction so far as they do not depart from the spirit and scope of the present invention.

BRIEF DESCRIPTION OF THE ACCOMPANYING DRAWING

Specific embodiments of the present invention have been chosen for the purpose of illustration and description, and are shown in the accompanying drawing, forming a part of the specification, in which.

DETAILED DESCRIPTION OF PREFERRED EMBODIMENTS

In the following, the present invention will be described in detail with reference to several preferred embodiments thereof as shown in the accompanying drawing.

Figure 1:
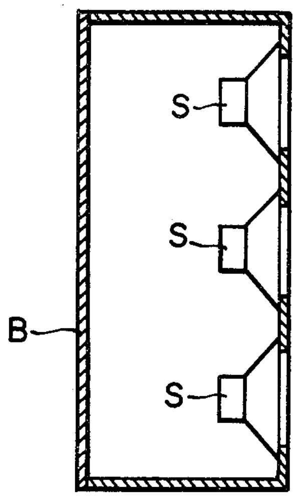
FIG. 1 is a side elevational view, in longitudinal cross-section, of a conventional flat plane arrangement type, space composite loud-speaker.
Figure 2:
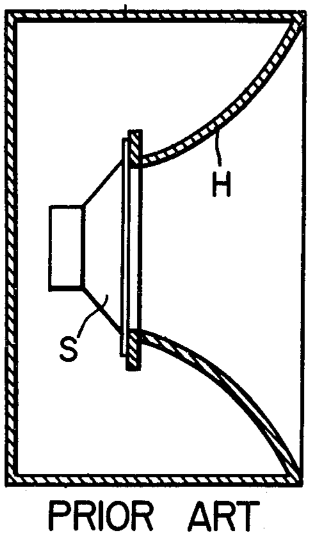
PRIOR ART FIG. 2
FIG. 2 is a side elevational view, in longitudinal cross-section, of a conventional horn speaker.
Figure 3:
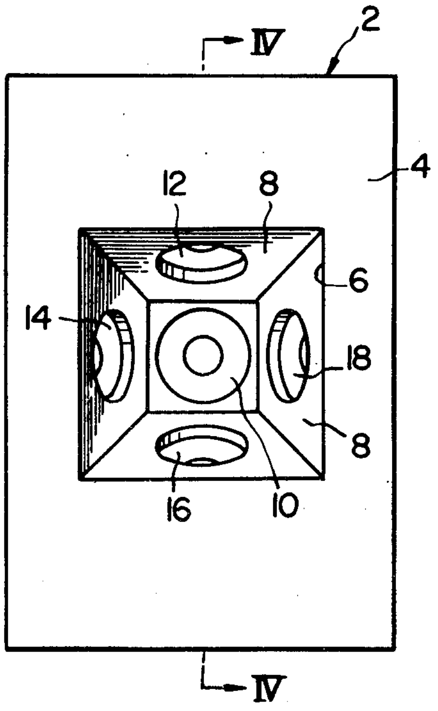
PRIOR ART FIG. 3
FIG. 3 is a front view of one embodiment of the loud-speaker according to the present invention.
Figure 4:
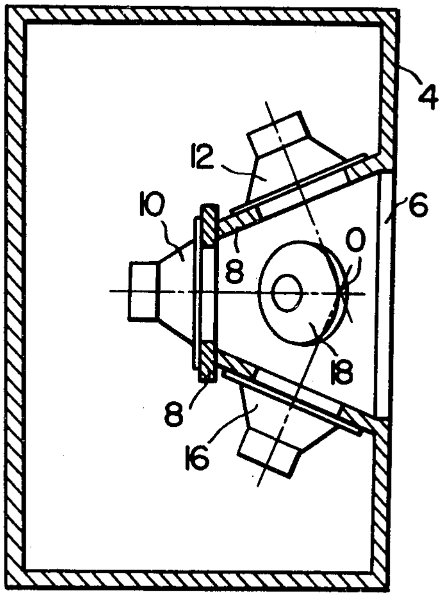
FIG. 4 is a side-elevational view, in longitudinal cross-section, as viewed along a line IV—IV in FIG. 3.

Referring to FIGS. 3 and 4, a reference numeral 4 designates baffle board constituting the front wall of a loud-speaker box or casing 2 and a numeral 6 refers to a fitting hole or an opening for the loud-speaker formed in the baffle board 4. Five speaker units 10 to 18, in this embodiment, are intensively fitted on speaker fitting plates 8 mounted around and behind the speaker fitting opening 6. The sound wave radiating direction of each of the speaker units 10 to 18 is concentrated on a single point 0 just behind the speaker fitting opening, i.e., the opening 6 formed in the baffle board 4.

The total area of the diaphragms of the entire speaker units 10 to 18 is so determined that it may be substantially equal to, or larger than, the area of the opening 6 in the baffle board 4.

Figure 5:
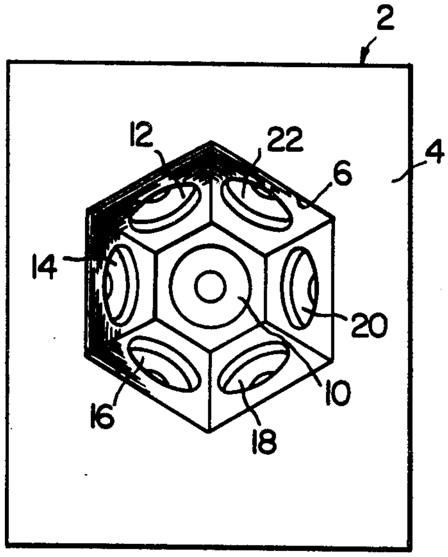
FIG. 5 is a front view of another embodiment of the loud-speaker according to the present invention.

FIG. 5 illustrates another embodiment, in which seven speaker units 10 to 22 are fitted behind the opening 6 in the baffle board 4 in the above-described manner.

Figure 6:
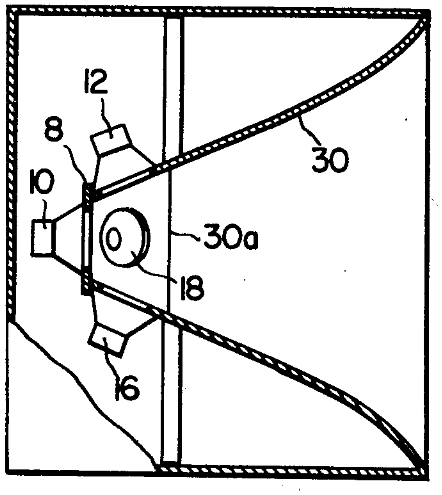
FIG. 6 is a side-elevational view, in longitudinal cross-section, of still another embodiment of the present invention, wherein the loud-speaker of a construction as shown in FIGS. 3 and 4 has been incorporated in the horn speaker.

FIG. 6 is still another embodiment, in which the arrangement of the speaker units shown in FIGS. 3 and 4 have been applied to a horn speaker in the same manner as in the above-described embodiment, wherein the total area of the diaphragm of the entire speaker units 10 to 18 is substantially equal to, or larger than, the area of a throat 30*a* of the horn 30. The total area of the diaphragms of the speaker units should preferably range from about 1 to 1.5 times as large as the area of the opening 6 formed in the baffle board 4 (FIG. 5) and the throat 30*a* of the horn 30 (FIG. 6).

In FIG. 6, the fitting plate 8 for the center speaker unit is constructed to have the same function as the baffle board 4 in the previous embodiments.

The above-described speaker units 10 to 18 (in the FIGS. 3 and 6 embodiments) and the speaker units 10 to 22 (in the FIG. 5 embodiment) may be of the same type and have the same diameter at its mouth. It is also possible to provide an equalizer on the speaker unit 10 which is situated at the center position of the arrangement.

As stated above, the loud-speaker according to the present invention is so constructed that a plurality of speaker units 10, 12, . . . are intensively arranged behind the baffle board 4 or the sounding horn 30, that the sound wave radiating direction in each speaker unit is concentrated on the center axis of the opening 6 in the baffle board 4 or the throat 30*a* of the sounding horn 30, and that the total area of the entire diaphragms of the speaker units 10, 12, . . . is made substantially equal to, or larger than, the area of the opening 6 in the baffle board 4 or the throat 30*a* of the sounding horn 30, as mentioned in the foregoing. Consequently the sound pressure produced from each of the speaker units 10, 12, . . . concentrates on the substantial center axis of the opening 6 or the throat 30*a* to thereby create an imaginary vibrating plane of high sound pressure density at that position. Also, since the opening for emitting the sound is only one, there is almost no interference of sound at the front face of the baffle board 4.

Accordingly, in case n numbers of the speaker units are fitted on the baffle board, the output sound pressure level surely becomes n times as high as the output sound pressure level of each unit, hence it is excellent in its sound quality and suitable for reproducing not only the low-pitched sound region but also the medium and high-pitched sound regions.

Also, since the sound, the output of which has been improved times as high as its original level, is radiated from a single opening, it has a definite directivity even when it is in the low-pitched sound region. Therefore, when such arrangement of the speaker units is combined with the sounding horn, much sharper directivity can be obtained, and, moreover, when such speaker unit arrangement is combined with a high-pitched sound speaker of good directivity, reproduction of the sound with good balance in the whole bands becomes possible.

Further, when such speaker unit arrangement is applied to a horn speaker, satisfactory horning effect can be exhibited, since, even when the speaker units 10, 12, . . . perform partitioning vibration, the total area of these small vibrating portions is not so small as the throat area of the horn, and they can effectively function as the imaginary vibrating plane, such speaker is useful as the high output loud-speaker for reproducing the medium and low-pitched sounds.

Figure 7:
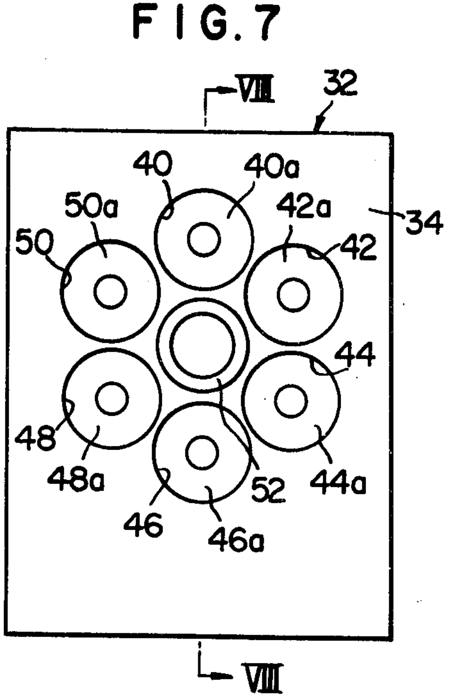
FIG. 7 is a front view of another embodiment of the loud-speaker according to the present invention.
Figure 8:
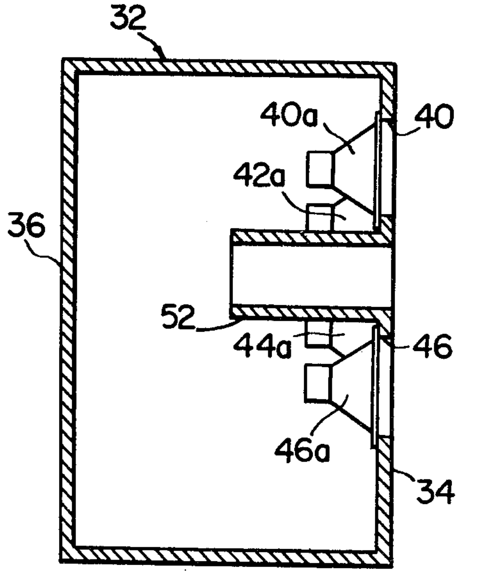
FIG. 8 is a side-elevational view, in longitudinal cross-section, as viewed along a line VIII—VIII in FIG. 7.

In still other embodiment of the loud-speaker according to the present invention as shown in FIGS. 7 and 8, a reference numeral 32 designates a speaker box which consists of a baffle board 34 and an enclosure 36. Six loud-speaker fitting openings 40 to 50 are arranged in a circle and in a mutually adjacent position around a duct 52 for phase inversion (bass reflex) at a substantially middle portion of the baffle board 34 and in a mutually adjacent positional relationship.

Behind each of these speaker fitting openings 40 to 50, each one of speaker units 40*a* to 50*a* is fitted with the sound wave radiating direction thereof being made parallel with the center axis of the loud-speaker fitting openings 40 to 50. It should be noted that the phase-inverting duct 52 at the center of the group of the surrounding speaker units 40*a* to 50*a* is common to all of them.

Figure 9:
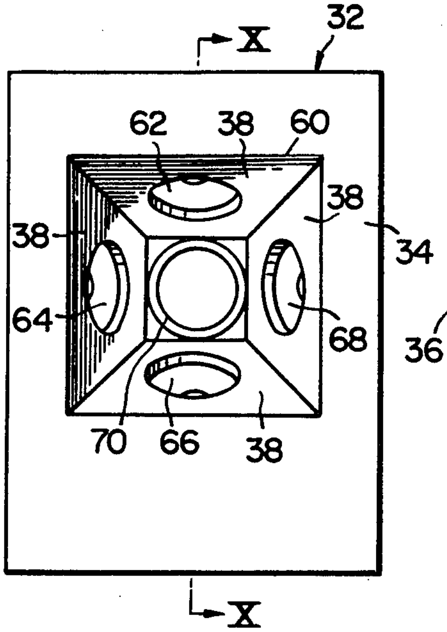
FIG. 9 is a front view of still other embodiment of the loud-speaker according to the present invention.
Figure 10:
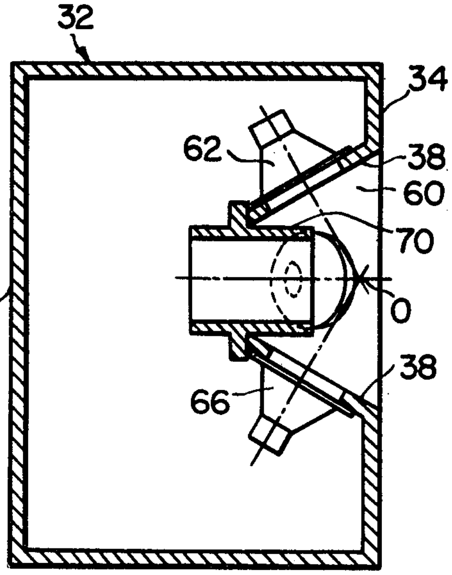
FIG. 10 is a side-elevational view, in longitudinal cross-section, as viewed along a line X—X in FIG. 9.

FIGS. 9 and 10 illustrate further embodiment of the loud-speaker according to the present invention, wherein a single large opening 60 is formed at the substantially middle part of the baffle board 34, behind which four speaker units 62 to 68 are arranged with the sound wave radiating direction thereof being concentrated on a single point 0 positioned immediately behind the center of the opening 60. The fitting plates 38 for the speaker units 62 to 68 constitute integral parts of the baffle plate 34 and have the same function as the baffle board 34.

As already mentioned in the foregoing, the total area of the diaphragms of the speaker units 62 to 68 in this embodiment is also determined such that it may be substantially equal to, or larger than, the opening 60 of the baffle plate 34. A duct 70 for the phase-inversion is provided behind the opening 60 or at the center of the group of the speaker units.

Figure 11:
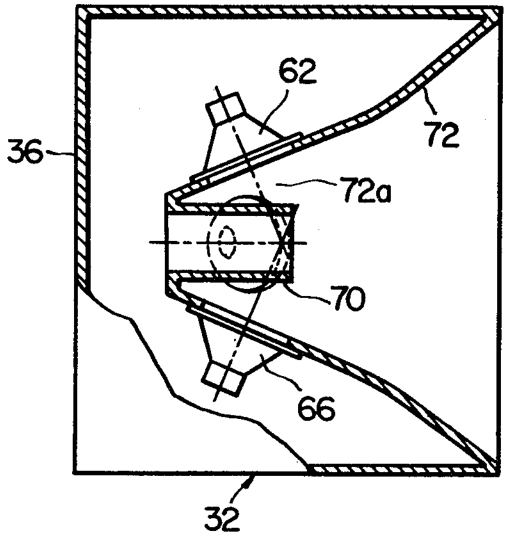
FIG. 11 is a side-elevational view, partly in longitudinal cross-section, of a further embodiment of the present invention, wherein the loud-speaker of a construction as shown in FIGS. 9 and 10 has been incorporated in the horn speaker.

FIG. 11 illustrates an example, wherein the arrangement of the speaker units as already shown in FIGS. 9 and 10 is incorporated in a horn speaker in the same manner as in the FIG. 9 embodiment. In this embodiment, the duct 70 for the phase-inversion is provided in the innermost part of the horn 72. Around duct 70, a plurality of speaker units 62 to 66 are fitted with the sound wave radiating direction thereof being concentrated on the center axis of the throat 72*a* of the horn 72. In this case, too, the total area of the diaphragms of the entire speaker units 62 to 66 is substantially equal to, or larger than, the area of the throat 72*a* of the horn 72.

As stated in the foregoing, since the loud-speaker according to the present invention intensively arranges a plurality of speaker units 62 to 66 behind the baffle board 34 or the sounding horn 72 with the sound wave radiating direction of each speaker units 62 to 66 being made to the center axis of the opening 40 or 60 of the baffle board 34 or of the throat 72*a* of the sounding horn 72, or in parallel with the center axis, and, in addition, a phase-inverting duct 70 is disposed at the center of the intensively arranged speaker units with it being made common to all speaker units 62 to 66, not only there is no interference like that caused among a plurality of ducts as in the conventional speaker units, but also the sound interference in front of the speaker units is negligible, because the speaker units 62 to 66 and the single phase-inverting duct 70 for the speaker units are in a short distance. Moreover, since the front and rear sides of the diaphragms of the speaker units 62 to 66 are communicated by the single and common duct 70, even if the speaker unit is of a small diameter, its resonance in the low-pitched sound region can be easily obtained, whereby the low-pitched sound can be faithfully reproduced to the original.

Furthermore, since the low-pitched tone emitted from each of the speaker units 62 to 66 and the phase-inverting duct 70 can be effectively overlapped, attenuation of the sound pressure in the low-pitched tone region can be suppressed.

The intensive arrangement of a plurality of the speaker units 62 to 66 and the phase-inverting duct 70 distinguishes more clearly a definite position of a sound image as well as amelierates association of the sounds.

By the combined use of a plurality of speaker units, the total effective vibrating area thereof acts as the sound source, so that satisfactory sound pressure comparable with the large diameter speaker unit can be obtained, even if the individual speaker unit is small in its diameter. In addition, the frequency characteristic of the speaker unit is favorable due to its being small in diameter, and its transition characteristic is also excellent.

The mass of the vibrating system of the abovementioned each speaker unit is smaller than the vibrating system of the large-diameter speaker unit, so that it can respond smoothly and without failure even to a very feeble input signal, hence reproduction of sound over a wide range of bands is possible along with reinforcing effect of the low-pitched tone by the single common phase-inverting duct.

Incidentally, as in the embodiments of FIGS. 9 and 11, when the speaker units 62 to 66 are disposed with their vibrating planes being made to the opening 60 of the baffle board 34 or to the center axis of the throat 72*a* of the sounding horn, there is created the imaginary vibrating plane of high sound pressure density in front of the group of the speaker units, and the large sound volume can be obtained, the directivity of which is favorable even at the low-pitched tone.

What is claimed is:

1. A loudspeaker, comprising:

(a) a casing for accommodating therein speaker units, said casing being enclosed, except for an open front part, by four side walls and a back wall;

(b) a sounding horn provided in the open front part of said casing, said sounding horn having a throat opening lying in a plane substantially parallel to said back side wall and being symmetrical about a line perpendicular to said back side wall;

(c) a plurality of speaker fitting panels mounted around and behind said throat at an angle to the plane of said throat diverging in the direction of said throat, the forward edges of said fitting panels defining a plane coincident with the plane of the throat opening, and a back fitting panel mounted on said speaker fitting panels, parallel to said back side wall, behind said throat; and (d) a plurality of speaker units intensively mounted on said speaker fitting panels around and behind said throat opening, and a back speaker unit mounted on the said back fitting panel, the total area of the entire diaphragms of said speaker units being substantially equal to, or larger than, the area of said throat opening, the sound wave radiating direction of said speaker units mounted on said speaker fitting panels' being concentrated on a single imaginary point behind the plane of said throat opening, hence within the ambit of the space defined by said speaker fitting panels and on the said line perpendicular to the back about which the said throat opening is symmetrical, and the sound wave radiation direction of said back speaker unit being along said line.

2. The loudspeaker as set forth in claim 1 wherein the total area of the entire diaphragms of said speaker units is larger by about 1 to 1.5 times than the area of the throat opening in said sounding horn.

* * * * *